(12) United States Patent
Wickersham, Jr. et al.

(10) Patent No.: US 8,231,745 B2
(45) Date of Patent: Jul. 31, 2012

(54) SPUTTERING TARGET AND METHOD OF FABRICATION

(75) Inventors: Charles E. Wickersham, Jr., Billerica, MA (US); Vladimir Levit, Billerica, MA (US); P. Todd Alexander, Billerica, MA (US)

(73) Assignee: Global Advanced Metals, USA, Inc., Waltham, MA (US)

( * ) Notice: Subject to any disclaimer, the term of this patent is extended or adjusted under 35 U.S.C. 154(b) by 0 days.

(21) Appl. No.: 13/169,284

(22) Filed: Jun. 27, 2011

(65) Prior Publication Data

US 2011/0297536 A1  Dec. 8, 2011

Related U.S. Application Data

(62) Division of application No. 11/055,535, filed on Feb. 10, 2005, now Pat. No. 7,998,287.

(51) Int. Cl.
*C22C 27/02* (2006.01)
*C22F 1/18* (2006.01)

(52) U.S. Cl. ........................................ 148/422; 148/668

(58) Field of Classification Search .................. 148/422, 148/668
See application file for complete search history.

(56) References Cited

U.S. PATENT DOCUMENTS

| | | | |
|---|---|---|---|
| 4,209,375 A | 6/1980 | Gates et al. | |
| 4,844,746 A | 7/1989 | Hormann et al. | 239/5 |
| 5,615,465 A | 4/1997 | Broussoux et al. | 29/1.21 |
| 5,836,506 A | 11/1998 | Hunt et al. | |
| 6,193,821 B1 | 2/2001 | Zhang | 148/668 |
| 6,238,494 B1 | 5/2001 | Segal | 148/421 |
| 6,283,357 B1 | 9/2001 | Kulkarni et al. | |
| 6,302,977 B1 | 10/2001 | Liu | |
| 6,348,113 B1 | 2/2002 | Michaluk et al. | 148/668 |
| 6,348,139 B1 | 2/2002 | Shah et al. | 204/298.13 |
| 6,976,380 B1 | 12/2005 | Hartwig, Jr. et al. | |
| 2002/0063056 A1 | 5/2002 | Shah et al. | 204/298.13 |
| 2002/0112789 A1 | 8/2002 | Jepson et al. | 148/422 |
| 2002/0125128 A1 | 9/2002 | Turner | 204/298.13 |
| 2002/0153071 A1 | 10/2002 | Segal et al. | 148/684 |
| 2003/0089429 A1 | 5/2003 | Koenigsmann et al. | 148/422 |
| 2007/0089815 A1 | 4/2007 | Wickersham, Jr. et al. | |

FOREIGN PATENT DOCUMENTS

| | | |
|---|---|---|
| DE | 645631 | 6/1937 |
| JP | 05-255752 | 10/1993 |
| WO | WO 02/42513 A2 | 5/2002 |
| WO | WO 02/070765 A1 | 9/2002 |
| WO | WO 2004/111295 A1 | 12/2004 |

OTHER PUBLICATIONS

Invitation to Pay Additional Fees with Communication Relating to the Results of the Partial International Search for PCT/US2006/004143 dated Jul. 17, 2006.

(Continued)

*Primary Examiner* — Jessee R. Roe
(74) *Attorney, Agent, or Firm* — Kilyk & Bowersox, P.L.L.C.

(57) ABSTRACT

A process is described for processing metal which includes clock rolling a metal plate until the desired thickness is achieved to form a rolled plate. Sputtering targets and other metal articles are further described.

13 Claims, 9 Drawing Sheets

Schematic diagram of metal working process that retains circular shape.

OTHER PUBLICATIONS

International Search Report and Written Opinion of the International Searching Authority for PCT/US2006/004143 dated Oct. 6, 2006.
isotropic.Dictionary.com. The American Heritage® Science Dictionary, Houghton Mifflin Company, http://dictionary.reference.com/browse/isotropic (accessed: Dec. 10, 2007).

Michaluk, "Affect of localized texture on sputter performance of tantalum," ICOTOM 12; 12$^{th}$ International Conference on Textures of Materials; Montreal, Quebec, Canada, Aug. 9-13, 1999, Abstract.
Michaluk, "Metallurgical Factors Affecting the Performance of Tantalum Sputtering Targets," May 2000, Conclusions.
C. Pokross, "Controlling the Texture of Tantalum Plate," Journal of Metals, Oct. 1989, pp. 46-49.

Schematic diagram of metal working process that retains circular shape.

FIG. 1

Schematic diagram of the 120 degree clock rolling process

FIG. 2

(111), (110) and (100) pole figures from tantalum sputtering target metal.

FIG. 3

Microstructure of tantalum sputtering target metal disk (cross-sectional view).

FIG. 4

| Product | Ingot Dia (inches) | Swage Dia | Swage True Strain | Swage True Strain | Roll True Strain | Total True Strain 1 Anneal | Total True Strain 2 Anneal |
|---|---|---|---|---|---|---|---|
| A | 7.36 | 5 | 0.77 | 0.94 | 1.25 | 2.97 | 2.20 |
| A | 11.00 | 5 | 1.58 | 0.94 | 1.25 | 3.77 | 2.20 |
| B | 7.36 | 5 | 0.77 | 0.97 | 1.29 | 3.04 | 2.26 |
| B | 11.00 | 5 | 1.58 | 0.97 | 1.29 | 3.84 | 2.26 |
| C | 7.36 | 5 | 0.77 | 1.19 | 1.58 | 3.55 | 2.77 |
| C | 11.00 | 5 | 1.58 | 1.19 | 1.58 | 4.35 | 2.77 |
| D | 7.36 | 6 | 0.41 | 1.19 | 1.58 | 3.18 | 2.77 |
| D | 11.00 | 6 | 1.21 | 1.19 | 1.58 | 3.98 | 2.77 |
| E | 7.36 | 6 | 0.41 | 1.38 | 1.83 | 3.63 | 3.22 |
| E | 11.00 | 6 | 1.21 | 1.38 | 1.83 | 4.43 | 3.22 |

True strain at various stages of the process for one or two annealing steps.

FIG. 5

Targets per Ingot

| Target | Rectangular Process | Circular Process | Yield Improvement |
|---|---|---|---|
| A | 30 Targets | 72 Targets | 240% |
| C | 24 Targets | 39 Targets | 162% |
| D | 9 Targets | 17 Targets | 189% |
| E | 4 Targets | 8 Targets | 200% |

Yield improvement obtained with circular processing over prior art rectangular process.

FIG. 6

Graph showing difference in earing after forming orthogonal and clock rolled plate into a 10.5 inch diameter domed shape.

(111), (110), and (100) pole figures from tantalum sputtering target metal.

SPUTTERING TARGET AND METHOD OF FABRICATION

This application is a divisional of U.S. patent application Ser. No. 11/055,535, filed Feb. 10, 2005 (now allowed), which is incorporated in its entirety by reference herein.

BACKGROUND OF THE INVENTION

The present invention relates to sputtering targets, such as tantalum and tantalum alloy-sputtering targets, and methods to make the same.

In the sputter application field, a sputtering target assembly typically includes a sputter target and a backing plate. For instance, a metal target or metal target blank (e.g., tantalum, titanium, aluminum, copper, cobalt, tungsten, hafnium, and the like) is bonded onto a backing plate. The backing plate can be, for example, a backing plate flange assembly such as copper, aluminum, or alloys thereof. Among the factors that can affect sputtering performance of a given sputtering target assembly is the grain size and crystallographic orientation of the grains relative to the sputtering plane. The desired grain size and crystallographic texture are simultaneously achieved by using a combination of mechanical deformation and annealing.

Previous methods for forming the desired metallurgical structure in tantalum, for instance, has included mechanical deformation by forging, rolling, extrusion, and combinations thereof. Previous methods of forming tantalum sputtering targets relied upon multiple annealing steps between the mechanical deformation steps to recrystallize the grains to produce a uniform fine grain microstructure with either the (111) or (100) crystallographic planes parallel to the sputtering target plane.

For example, Michaluk et al., U.S. Pat. No. 6,348,113, describes various embodiments where, in one embodiment, tantalum metal is cross-rolled at 90 degrees and rectangular plate is used to make circular sputtering target disks by cutting.

Segal (U.S. Published Patent Application No. US 2002/0153071A1) relates to fabrication methods for FCC metals. Jepson (U.S. Published Patent Application No. 2002/0112789 A1), Hormann et al. (U.S. Pat. No. 4,884,746), Turner (U.S. Published Patent Application No. 2002/0125128 A1), Zhang (U.S. Pat. No. 6,193,821), and Broussoux et al. (U.S. Pat. No. 5,615,465) relate to the production of tantalum plate for sputtering targets and other uses by creating rectangular plates by various methods and then cutting a circular disk from the plate. This method can be very wasteful of expensive tantalum material.

Koenigsmann et al. (U.S. Published Patent Application No. 2003/0089429) relates to the production of tantalum sputtering targets by a powder metallurgical process. Shah et al. (U.S. Published Patent Application No. 2002/0063056 A1) relates to the production of tantalum sputtering target plate with strong (100) texture using lubricated dies and rolling in orthogonal directions. Segal (U.S. Pat. No. 6,238,494 B1) and Shah et al. (U.S. Pat. No. 6,348,139 B1) relate to the production of tantalum circular plate with strong (100) texture. In this process, circular tantalum plates are produced by a combination of forging the ingot and rolling. They reported that they needed to lubricate the dies during forging and use the lowest possible temperature for recrystallization to produce tantalum targets with strong (100) texture and suitable grain size and crystallographic texture uniformity.

In all of these methods the tantalum deformation steps are interrupted by annealing steps in order to recrystallize the tantalum to reduce the plastic strain in the metal to avoid cracking and to remove the work hardening of the metal to make the metal easier to work.

In addition, all of these methods show the transformation of the cylindrical ingot into a rectangular or square shape by forging and rolling operations and then cutting the rectangular or square plate into circles to manufacture a circular sputtering target. This conversion from circular ingot shape to rectangular shape and back to circular shape is very inefficient and wasteful of material.

SUMMARY OF THE PRESENT INVENTION

It is therefore a feature of the present invention to provide a process of making metal articles, such as sputtering targets, which are subjected to thermal-mechanical working and preferably annealed only once at the end of the working process or twice with an intermediate anneal in the middle of the metal working process and an anneal at the end of the metal working process.

Another feature of the present invention is to provide a process which forms a circular article, such as a sputtering target, while maintaining the circular shape throughout the entire formation process.

A further feature of the present invention is to provide a metal article, such as a sputtering target, which has very strong crystallographic texture, such as strong (111) crystallographic texture.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a process for processing metal which comprises clock rolling a metal plate with at least two rolling passes until the desired thickness of the metal plate is achieved to form a rolled plate. Preferably, the metal is a BCC metal and, more preferably, tantalum or niobium or alloys thereof.

The present invention further relates to a method of making a circular metal article and comprises processing a metal ingot having a cylindrical shape so that the cylindrical shape is maintained throughout the process.

The processes of the present invention are especially useful in forming sputtering targets.

Also, the present invention relates to metal, such as tantalum metal or niobium metal, formed from one or more of the processes of the present invention.

In addition, the present invention relates to sputtering targets, such as tantalum or niobium sputtering targets, formed by imparting a true strain, prior to annealing, of about 3.0 or higher.

It is to be understood that both the foregoing general description and the following detailed description are exemplary and explanatory only and are intended to provide a further explanation of the present invention, as claimed.

The accompanying drawings, which are incorporated in and constitute a part of the application, illustrate some of the embodiments of the present invention, and together with the description, serve to explain the principles of the present invention.

DETAILED DESCRIPTION OF THE PRESENT INVENTION

The present invention relates to processes to form metal articles, such as sputtering targets. In general, the present invention relates to the use of clock rolling of the metal to achieve the desired dimensions of the rolled metal. As provided in more detail below, the clock rolling of the metal provides a unique way to achieve a dramatic reduction in texture banding and further provides small and uniform grain size throughout the metal surface and thickness. One embodiment of the present invention relates to a process for processing or rolling metal comprising the clock rolling of a metal plate until the desired thickness is achieved to form a rolled plate. The clock rolling generally involves at least two rolling passes and preferably involves at least three rolling passes, such as from 3 rolling passes to 30 or 40 rolling passes or more. Any number of rolling passes within this range or above this range can be used depending upon the desired thickness, and uniformity of texture, and/or grain size. With respect to the metal, preferably the metal processed in the present invention is a valve metal or refractory metal or BCC metal but other metals could also be used. Specific examples of the type of metals that can be processed with the present invention include, but are not limited to, tantalum, niobium, copper, titanium, gold, silver, cobalt, and alloys thereof.

Figure 1:
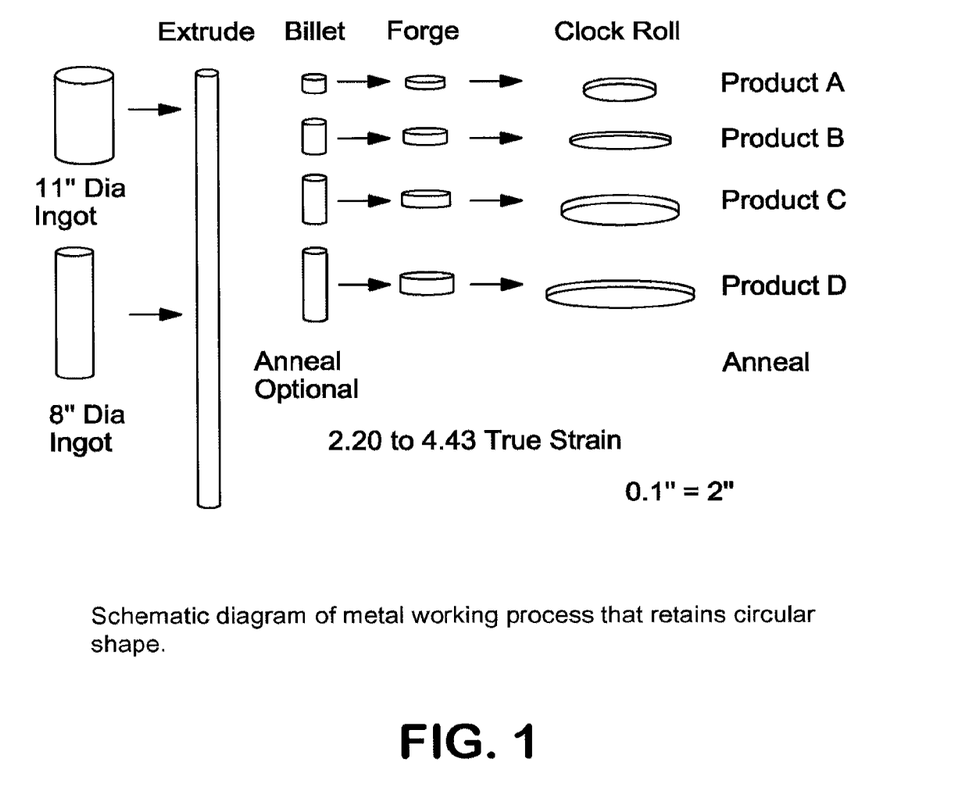
FIG. 1 is a schematic diagram of the process steps used to fabricate metal plate for use in manufacturing sputtering targets.
Figure 2:
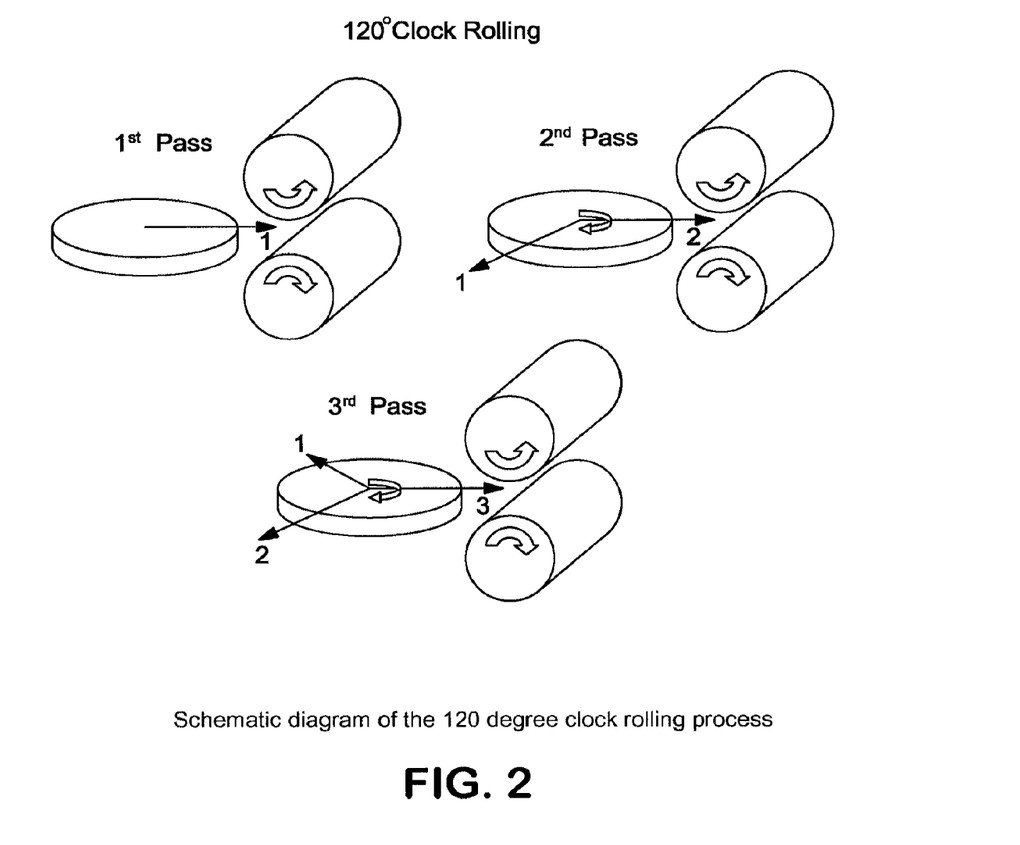
FIG. 2 is a schematic diagram showing the relationship between rolling passes for 120-degree clock rolling.

For purposes of the present invention, clock rolling is where a metal article, such as metal plate, is passed through a rolling mill such as shown in FIG. 2. Any conventional rolling mill which is capable of causing metal deformation, such as reducing the thickness of the metal, can be used. As shown in FIG. 2, clock rolling involves rolling a piece of metal, such as a circular disk, through a rolling mill or press and afterwards, the metal disk is rotated a certain number of degrees and then passed again through the rolling mill, and afterwards, optionally, rotated again a certain number of degrees and passed through the rolling mill again. After each pass, the same or different true strain can be imparted to the metal by the amount of force imparted by the rolling mill. FIG. 2 shows a preferred clock rolling, which involves a 120° shifting of the disk after each pass. Instead of 120° shifting, generally, any degree of shifting which is preferably more than a 90° shift or less than a 90° shift can be used. In other words, the shifting of the metal article after each pass can be 100° or more, such as 100° to 170°, after each pass. The number of degrees that the target is shifted after each pass can be the same or different. For instance, as shown in FIG. 2, the metal disk is shifted 120° after each pass. Instead, the metal can be shifted 120° after the first pass, and then can be shifted 100° after the second pass, and optionally, the third pass can involve a degree shifting of 120°, 150°, and the like. As stated, the shifting generally is more than 90° to avoid a mere transverse or cross-directional rolling schedule. Furthermore, preferably, after each rolling pass, the shifting of the article will not be within 10° of being transverse or cross-directional. Furthermore, the clock rolling can involve turning the metal article upside down and then subjecting the article to further clock rolling. It is optional to rotate the metal a certain number of degrees prior to starting a new set of rolling passes. In other words, and with reference to FIG. 2, if a 120° clock rolling is used, after 3 passes, instead of rolling at the same starting point designated as 1 with the next rolling, the metal can be rotated any number of degrees, such as 10° to 110°, prior to the next pass so that the rolling direction is scattered throughout the metal disk or other article.

In at least one embodiment, no annealing is provided to the work piece prior to or during the rolling operation. The rolling operations can be conducted at room temperature. During the deformation process, the work piece temperature can increase in temperatures, e.g., for tantalum—to approximately 150° C. It is possible to heat the work piece prior to rolling to a temperature, for instance, of 40° C. to 350° C. to reduce the force required from the rolling mill. Using a large number of rolling passes to achieve the desired thickness enhances uniformity of the part. True strain per rolling pass typically ranges from about 0.3 to about 0.04.

The metal that is subjected to clock rolling can be obtained by forging or otherwise mechanically deforming a billet to form the metal plate that is subjected to clock rolling.

In one embodiment, the true strain imparted by clock rolling can be from about 1.0 to about 2.0, and more preferably, from about 1.2 to about 1.9, or any number in between. Furthermore, the true strain imparted by each single rolling pass can be from about 0.02 to about 0.5. Other true strain values above or below this range can also be achieved.

As stated, the clock rolling can involve clock rolling on one side of the metal plate and then clock rolling on the opposite side of the metal plate. The number of passes of clock rolling on one side and then on the opposite side can be the same or different or can be similar.

The forging of the billet to obtain the metal plate is preferably axial forging. The forging can impart, in at least one embodiment, a true strain of from about 0.75 to about 2.0. The true strain value can be above or below this range, as well. The billet that is subjected to forging can have a ratio of billet length to billet diameter of about 3 or less. Preferably, the forging imparts a true strain ranging from about 0.8 to about 1.4.

The billet can be obtained by extruding or swaging a metal ingot to a desired diameter to form an extruded or swaged ingot. The ingot can be commercially available. The ingot can be prepared in accordance with the teachings of Michaluk et al., U.S. Pat. No. 6,348,113, incorporated herein by reference. The method may also include directly casting the high purity tantalum metal into a form suitable for deformation processing or can form the slab by electron beam melting. The extruded or swaged ingot can optionally be cut into any size billet for further processing, such as forging, as described above. The swaged or extruded ingot is next cut into billets with a volume so that the required plate volume can be produced. For example, if a metal plate with a thickness of 0.5 inch and diameter of 10 inch is desired, then a 4-inch diameter billet with a length of slightly larger than 3.12 inches can be used. The billet cutting may be conducted by any conventional technique, such as water jet cutting, EDM, sawing, or turning on a lathe. The method of cutting the billet is not particularly critical to the process, provided that the surface finish on the billet is sufficient to prevent surface defects from propagating during the subsequent forming operations. The metal ingot can have any starting diameter, and preferably has a starting diameter of about 7 inches or more, such as from about 7 inches to about 13 inches or more. After extruding or swaging, the extruded or swaged ingot, such as billet, can have a diameter of from about 3 inches to about 7 inches, and more preferably, from about 3 inches to about 6 inches (e.g., 4, 5, or 6 inch diameter). Other ingot starting diameter ranges can be from 10 inches to 12 inches, from 8 inches to 10 inches, and 6 inches to 8 inches. When the starting ingot is extruded or swaged, in at least one embodiment, the true strain imparted by this extruding or swaging is from about 0.5 to about 2.0 (e.g., 0.77 to 1.58). Other ingot and billet sizes can be used. The grain size and crystallographic orientation uniformity of the disks tends to be enhanced by using ingots of 11 inch diameter and is the preferred method for producing sputtering targets. The swaging or extrusion operation is not required if the starting ingot diameter is on the order 3 to 6 inches in diameter. This swaging or extrusion can be performed at room temperature (10° to 35° C.). It is also possible to perform the swaging or extrusion operation at elevated temperatures such as above 35° C., like 40° C. to 350° C.

It is possible to process the part without annealing after the swaging or extrusion operation. However, if no anneal is provided after swaging or extrusion, the uniformity of the grain structure and orientation is not as uniform as it is if the billet is annealed after swaging and before forging and rolling.

The billet of the proper volume is next forged along the billet axis using a press. Press forces of around 5000 tons are typically used for pressing billets of tantalum with diameters of 4 to 6 inches. The billet pressing operation is typically conducted at room temperature. However, it is possible to conduct the billet pressing operation with tantalum billets at elevated temperatures, like 40° C. to 350° C. The press-forged billet can be annealed or annealing can be skipped.

The press-forged billet is inspected. If surface defects are found, they should be removed by grinding or machining. In addition, improved quality of the finished part is usually achieved if the billet is ground to have beveled edges to assist with the rolling operation. However, grinding to remove defects and beveling the edges is not required to produce an acceptable product. The true strain during the press forging can, for instance, range from 0.94 to 1.38.

Figure 8:
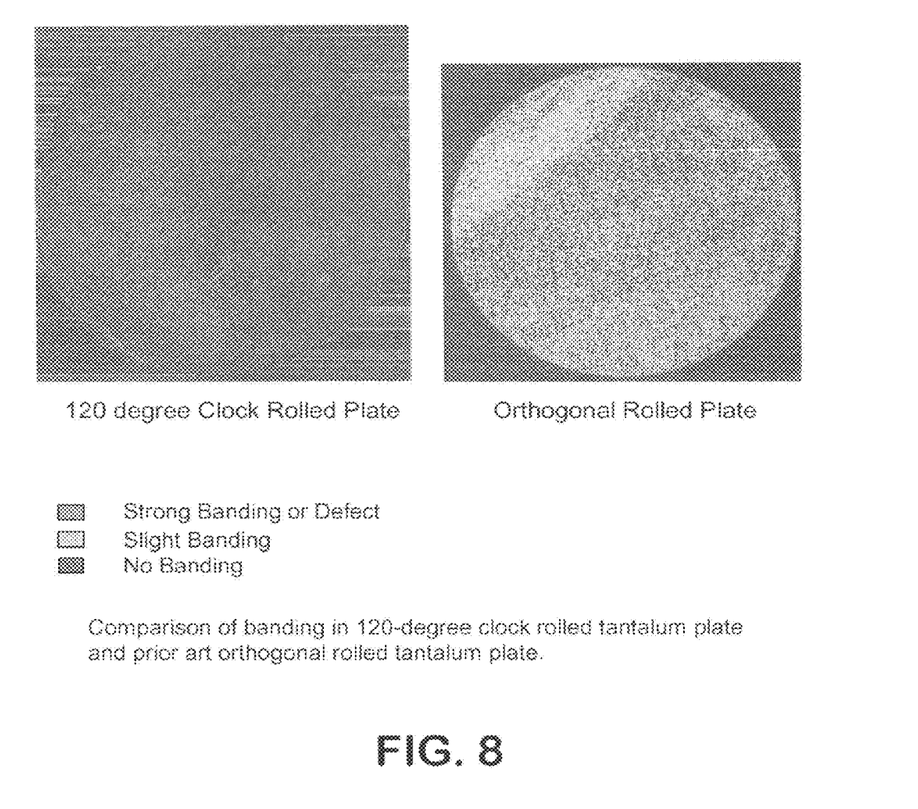
FIG. 8 shows a comparison of ultrasonic banding measurements on two tantalum plates; one rolled using clock rolling and the other rolled using an orthogonal rolling process. A dramatic reduction in texture banding is observed with clock rolling.

The press-forged billet can be deformed from the forged billet height to the final plate thickness by rolling. In one preferred embodiment, the rolling is conducted by rotating the work piece after each rolling pass by 120 degrees. After three passes the work piece may be flipped and rolled with another set of three rolling passes with 120 degree rotation of the work piece after each rolling pass. The angle between the first three pass set and the second three pass set is offset by 30 degrees. FIG. 2 shows the relationship between the first and second set of rolling passes. This process is repeated until the thickness of the plate equals the desired value. This rolling process is not orthogonal in order to activate all grains in the metal and reduce the propensity to form texture bands. FIG. 8 shows the difference that the 120 degree clock rolling makes in the level of texture banding in the rolled tantalum plates. No evidence of texture banding is found in the plate produced using 120 degree clock rolling, while the plate produced with orthogonal rolling process has a very high degree of texture banding as detected by the ultrasonic scanning technique.

Optionally, before and/or after any step in any of the processes described herein, one or more annealing steps can occur. In one embodiment, the rolled plate can be annealed (after clock rolling) and preferably no earlier annealing occurs beforehand throughout the entire process. In other words, there is no annealing of the ingot, the billet, or the forged billet into a plate.

As an option, after extruding or swaging the ingot, the extruded or swaged ingot can also be annealed. The grain size and crystallographic orientation uniformity of the disks tends to be enhanced by annealing the material after swaging or extruding and after rolling. However, acceptable grain size and crystallographic texture uniformity can also be achieved by annealing only after rolling.

If annealing is used after swaging, the anneal can occur before or after cutting the swaged ingot into billets. The choice will depend upon the capability of the annealing furnace to accept long swaged ingot or smaller cut billets.

With respect to annealing of the tantalum, preferably this annealing is in a vacuum annealing at a temperature and for a time sufficient to achieve complete recrystallization of the tantalum metal. As indicated above, the tantalum ingot and any form of the ingot formed afterwards can be annealed one or more times before and/or after any step mentioned herein. The annealing can be at any conventional annealing temperature, such as a temperature that causes at least partial recrystallization and/or alteration in grain size.

The annealing can occur at any suitable temperature. For instance, the annealing can be conducted in a vacuum at a temperature of from about 975° C. to about 1125° C. Other temperatures can be used. A heating rate of 10° to 50° C./min. (e.g., 30° C./min.) can be used. The grain size and crystallographic orientation uniformity of the disks tends to be enhanced by annealing the billets after forging and this is the preferred method for producing sputtering targets. However, in some cases this additional anneal is not required to meet the product requirements. In these cases, the intermediate anneal may be skipped.

The metal from the combined forging and rolling steps can have a true strain imparted by the steps that ranges from about 2 to about 3.5. However, other true strain values above and below this range can also be achieved.

In the process of the present invention, and in at least one embodiment, a true strain reduction of at least 3.0, at least 4.0, or, for instance, from about 3.0 to about 6.0, is imparted to the rolled plate during the entire process.

In another embodiment of the present invention, the present invention relates to a process for making a circular metal article which comprises processing a metal ingot having a cylindrical shape so that the cylindrical shape is maintained throughout the entire process. Put another way, the circular shape of the starting material maintains its circular shape throughout all the processing including extruding or swaging, forging, rolling, and any other processing of the metal, whether it is polishing, thermal mechanical working of the metal, and the like.

In the present invention, in one embodiment, by using a process of swaging, extrusion, rotary forging, and upset forging without lubrication in combination with clock rolling, circular metal target disks with very strong (111) crystallographic textures can be made. Instead of strong (111) textures, very strong (100) or other crystallographic textures can be obtained.

In one mode of the present invention, annealing does not interrupt the metal deformation and consequently, a higher true strain is inputted to the metal prior to annealing. For instance, tantalum with true strains of 4.43 or more have been achieved without annealing. The metal is preferably only annealed after all mechanical deformation is completed and only annealed once or twice during the target formation process. Annealing is an expensive process generally requiring that the metal be protected from oxygen and nitrogen by either a vacuum, argon atmosphere or by coating the metal in a protective layer that prevents oxygen and nitrogen diffusion into the metal. This is especially true for tantalum or niobium. Oxygen and nitrogen in tantalum are known to adversely affect the tantalum mechanical properties making tantalum less ductile. Consequently, by eliminating annealing steps in the manufacturing process, the quality of the metal is improved (e.g., less oxygen and nitrogen contamination) and the cost for producing the sputtering target is reduced.

In the present invention, the cylindrical ingot is processed so that the circular shape is maintained throughout the process. The material yield of the process is improved by a factor of at least two by maintaining circular shape.

In the present invention, the tantalum metal or other bcc metal, can have any purity such as 95% or greater. Preferably, the purity of the metal is 99% or greater, 99.95% or greater, 99.99% or greater, and 99.995% or greater. This purity can exclude gases. Preferably, the tantalum metal or other bcc metal has a purity of at least 99.999% and can range in purity from about 99.995% to about 99.999% or more. Other ranges include about 99.998% to about 99.999% and from about 99.999% to about 99.9992% and from about 99.999% to about 99.9995%. The present invention further relates to a metal alloy which comprises the bcc metal or tantalum metal, such as a tantalum based alloy or other alloy which contains the bcc metal or tantalum as one of the components of the alloy. While the description at times involves the preferred metal, tantalum, it is to be understood that the entire description throughout this application equally applies to other valve metal or bcc metals.

The impurities (e.g., metallic impurities) that may be present in the tantalum metal can be less than or equal to 0.005% and typically comprise other bcc refractory metals of infinite solubility in tantalum, such as niobium, molybdenum, and tungsten. For instance, metallic impurities, like Mo, W, and Nb (in the case of Ta) can be below (individually or combined) 100 ppm, below 50 ppm, below 20 ppm, below 10 ppm, or even below 5 ppm total. The oxygen content can be below 100 ppm, below 50 ppm, below 20 ppm, or below 10 ppm. All other elemental impurities, (including radioactive elements) whether metal or non-metal can be below a combined amount of 200 ppm, below 50 ppm, below 25 ppm, or below 10 ppm or even lower and optionally having 50 ppm or less $O_2$, 25 ppm or less $N_2$, or 25 ppm or less carbon, or combinations thereof.

The tantalum metal and alloys thereof containing the tantalum metal preferably have a texture which is advantageous for particular end uses, such as sputtering. As an option, in each of the embodiments described throughout the present invention, the texture can be uniform on the surface and/or throughout the thickness of the metal. Preferably, when the tantalum metal or alloy thereof is formed into a sputtering target having a surface and then sputtered, the texture of the tantalum metal in the present invention leads to a sputtering target which is easily sputtered and, very few if any areas in the sputtering target resist sputtering. Further, with the texture of the tantalum metal of the present invention, the sputtering of the sputtering target leads to a very uniform sputtering erosion thus leading to a sputtered film which is therefore uniform as well. A texture capable of resulting in a sputtering target which is easily sputtered can be a mixture of textures that are uniformly distributed in the tantalum metal.

It is preferred that the tantalum metal have a fine texture. In one embodiment, the texture is such that the (100) peak intensity within any 5% incremental thickness of the tantalum is less than about 15 random, and/or has a natural log (Ln) ratio of (111):(100) center peak intensities within the same increment greater than about −4.0 (i.e., meaning, −4.0, −3.0, −2.0, −1.5, −1.0 and so on) or has both the (100) centroid intensity and the ratio above. The center peak intensity is preferably from about 0 random to about 10 random, and more preferably is from about 0 random to about 5 random. Other (100) centroid intensity ranges include, but are not limited to, from about 1 random to about 10 random and from about 1 random to about 5 random. Further, the log ratio of (111):(100) center peak intensities is from about −4.0 to about 15 and more preferably from about −1.5 to about 7.0. Other suitable ranges of log ratios, include, but are not limited to, about −4.0 to about 10, and from about −3.0 to about 5.0. Most preferably, the tantalum metal of the present invention includes a grain size and preferred texture with regard to the (100) incremental intensity and the (111):(100) ratio of incremental centroid intensities. The method and equipment that can be used to characterize the texture are described in Adams et al., Materials Science Forum, Vol. 157-162 (1994), pp. 31-42; Adams et al., Metallurgical Transactions A, Vol 24A, April 1993— No. 4, pp. 819-831; Wright et al., International Academic Publishers, 137 Chaonei Dajie, Beijing, 1996 ("Textures of Material: Proceedings of the Eleventh International Conference on Textures of Materials); Wright, Journal of Computer-Assisted Microscopy, Vol. 5, No. 3 (1993), all incorporated in their entirety by reference herein. In one embodiment, the tantalum metal has a) an average grain size of about 50 microns or less, b) a texture in which a (100) pole figure, has a center peak intensity less than about 15 random or c) a log ratio of (111):(100) center peak intensities of greater than about −4.0, or a combination thereof.

For purposes of the present invention, the texture can also be a mixed texture such as a (111):(100) mixed texture and this mixed texture is preferably uniform throughout the surface and/or thickness of the plate or target. In another embodiment, the tantalum preferably has a primary or mixed (111) texture, and a minimum (100) texture throughout the thickness of the sputtering target, and is preferably sufficiently void of (100) textural bands.

Furthermore, with respect to the texture of the ingot, plate, or finished plate or target, the texture can be any texture such as a primary (100) or primary (111) texture or a mixed (111):(100) texture on the surface and/or throughout the thickness of the material, such as the slab. Preferably, the material, such as the slab, does not have any textural banding, such as (100) textural banding when the texture is a primary (111) or mixed (111):(100) texture.

The grain size of the tantalum metal can also affect the uniformity of the sputtering erosion and the ease of sputtering. The tantalum metal of the present invention can have any grain size. Preferably, the tantalum metal of the present invention includes an average grain size of about 1,000 microns or less, 750 microns or less, 500 microns or less, 250 microns or less, 150 microns or less, 100 microns or less, 75 microns or less, 50 microns or less, 35 microns or less, 25 microns or less, 20 microns or less, 15 microns or less, or 10 microns or less. Other grain sizes that are suitable in the tantalum metal of the present invention are grain sizes having an average grain size of from about 5 to about 125 microns. Preferably, the tantalum metal of the present invention includes an average grain size of from about 10 to about 100 microns. The tantalum metal of the present invention can include an average grain size of from about 5 to about 75 microns or from 25 to 75 microns, or from about 25 to about 50 microns. Also, in one embodiment, 95% of the grain sizes are 100 microns or less. This can be determined by measuring 500 grain sizes on a sample. Preferably, 95% of the grain sizes are 75 microns or less. Also, 95% of the grains can be less than 3 times the average grain size.

In one embodiment of the present invention, the product resulting from the process of the present invention preferably results in plates or sputter targets wherein at least 95% of all grains present are 100 microns or less, or 75 microns or less, or 50 microns or less, or 35 microns or less, or 25 microns or less. More preferably, the product resulting from the process of the present invention results in plates or sputter targets wherein at least 99% of all grains present are 100 microns or less or 75 microns or less or 50 microns or less and more preferably 35 microns or less and even more preferably 25 microns or less. Preferably, at least 99.5% of all grains present have this desired grain structure and more preferably at least 99.9% of all grains present have this grain structure, that is 100 microns or less, 75 microns or less, 50 microns or less and more preferably 35 microns or less and even more preferably 25 microns or less. The determination of this high percentage of low grain size is preferably based on measuring 500 grains randomly chosen on a microphotograph showing the grain structure.

In at least one embodiment, the plate (as well as the sputter target) can be produced wherein the product is substantially free of marbleizing on the surface of the plate or target. The substantially free of marbleizing preferably means that 25% or less of the surface area of the surface of the plate or target does not have marbleizing, and more preferably 20% or less, 15% or less, 10% or less, 5% or less, 3% or less, or 1% or less of the surface area of the surface of the plate or target does not have marbleizing. Typically, the marbleizing is a patch or large banding area which contains texture that is different from the primary texture. For instance, when a primary (111) texture is present, the marbleizing in the form of a patch or large banding area can be a (100) texture area which is on the surface of the plate or target and may as well run throughout the thickness of the plate or target. In one embodiment, this patch or large banding area can generally be considered a patch having a surface area of about 0.25% or more of the entire surface area of the plate or target and may be even larger in surface area such as 0.5% or 1%, 2%, 3%, 4%, or 5% or higher with respect to a single patch on the surface of the plate or target. There may certainly be more than one patch that defines the marbleizing on the surface of the plate or target. The present invention serves to reduce the size of the individual patches showing marbleizing and/or reduces the number of overall patches of marbleizing occurring. Thus, the present invention minimizes the surface area that is affected by marbleizing and reduces the number of marbleizing patches that occur. By reducing the marbleizing on the surface of the plate or target, the plate or target does not need to be subjected to further working of the plate or target and/or further annealing. In addition, the top surface of the plate or target does not need to be removed in order to remove the marbleizing effect.

Using the non-destructive banding test referred to above in U.S. Patent Application No. 60/545,617 (incorporated in its entirety by reference herein), the present application can confirm very low banding quantitatively in various embodiments of the present invention. Thus, in at least one embodiment, the present invention also relates to metal articles, such as metal plate, that have a very low amount of textural banding area in the metal. This percentage of textural banding area can be determined by the automatic ultrasonic detecting method described in U.S. Patent Application No. 60/545,617 or by other means. In more detail, based on the measurement data achieved by a detecting method, a percentage of banding in a portion or overall area of the metal article can be readily determined. As part of the present invention, the present invention relates to metal articles having a total percent banding area of less than 1% (based on the overall area scanned for detection). The percent of the banding area can be with respect to the percent banding area only within the thickness of the metal article. Thus, in at least one embodiment, the percent banding area excludes surface textural banding which is visible before or after the surface is etched. One way to determine the percent banding area, in the case of an ultrasonic detecting method, can be based on the number of pixels which meet a threshold level which correspond to textural banding. Put another way, the ultrasonic detecting method can be calibrated with a known object having banding, and thus, a threshold number can be obtained which would clearly indicate banding or correlate to banding. After this calibration is achieved, the metal article to be tested can then be subjected to the ultrasonic detection and the number of pixels meeting a threshold number, e.g., signal intensity, would be considered corresponding to a banding area. Upon the particular metal article or portion thereof being measured, the number of pixels meeting the pre-determined threshold would then be considered a detection of a texture banded area and the number of pixels having this banded area can then be compared to the overall number of pixels to determine the percent banding area. The amount of resolution used by the ultrasonic detecting method can be any resolution and, certainly, the higher the resolution, the more precise the percent banding area can be determined. For instance, the resolution can be 5 mm or less, and more preferably 1 mm or less. A resolution that works well is from about 0.5 mm to 1.5 mm with respect to the pixel resolution. The texture banding area percentages are all below 1%, e.g., from 0.10 or lower to 0.95%, and preferably from about 0.10 to 0.50% or less than 0.50%, or from 0.10 to 0.45%, or 0.10 to 0.25% or 0.1 to 0.4%. The present invention permits the lowest texture banding seen by the inventors thus far. While some of the previous methods by Cabot Corporation have made metals with low texture banding on the order of 0.6 or 0.7% or higher, the present invention has unexpectedly obtained metals with texture banding below 0.6% on a routine basis.

Figure 3:
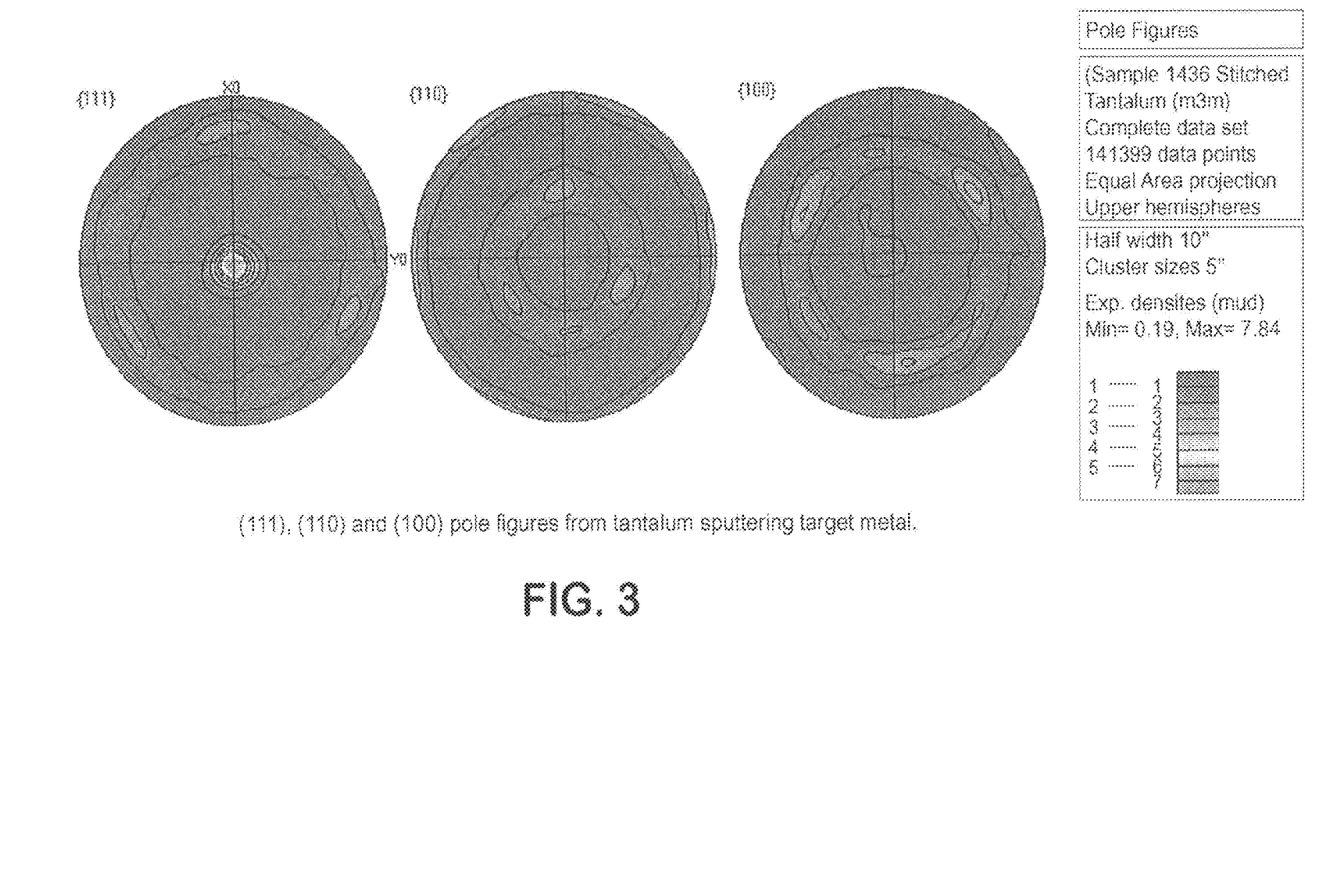
FIG. 3 provides (111), (110) and (100) pole figures for the tantalum plate fabricated using the method shown in FIG. 1.
Figure 4:
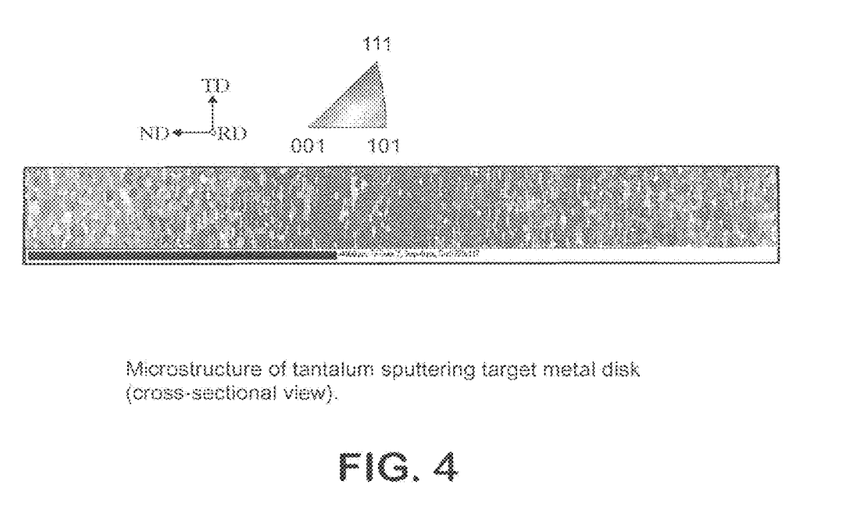
FIG. 4 is an electron backscatter diffraction (EBSD) map of a tantalum plate fabricated using the method shown in FIG. 1.
Figure 5:
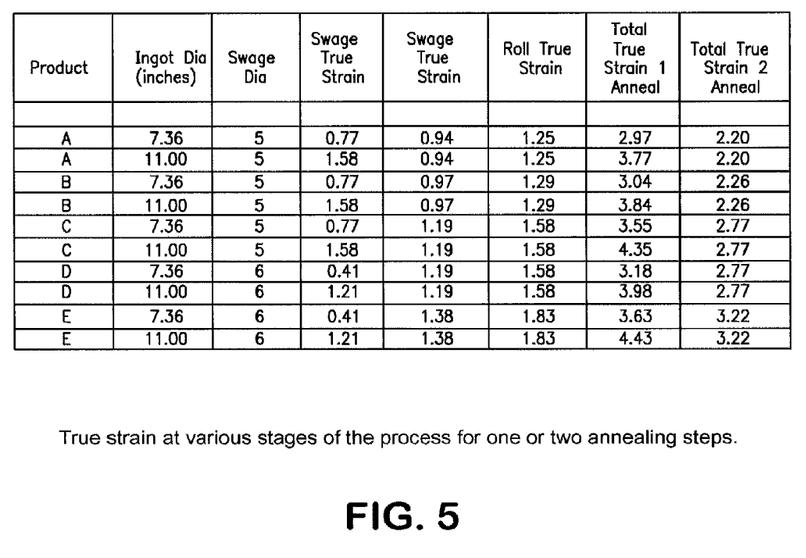
FIG. 5 is a table showing the true strains for various tantalum plates fabricated using a process of the present invention.
Figure 6:
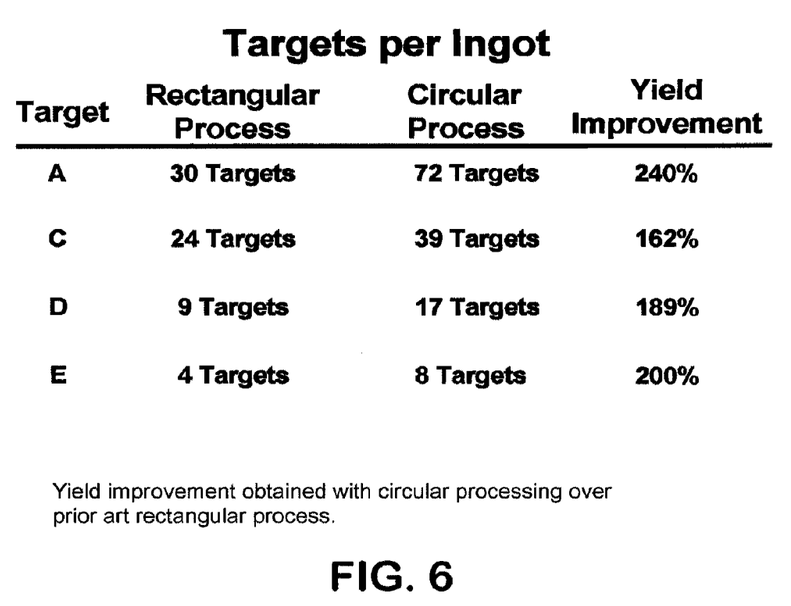
FIG. 6 is a table showing the improvement in material yield associated with using circular processing of ingot rather than rectangular processing methods.
Figure 9:
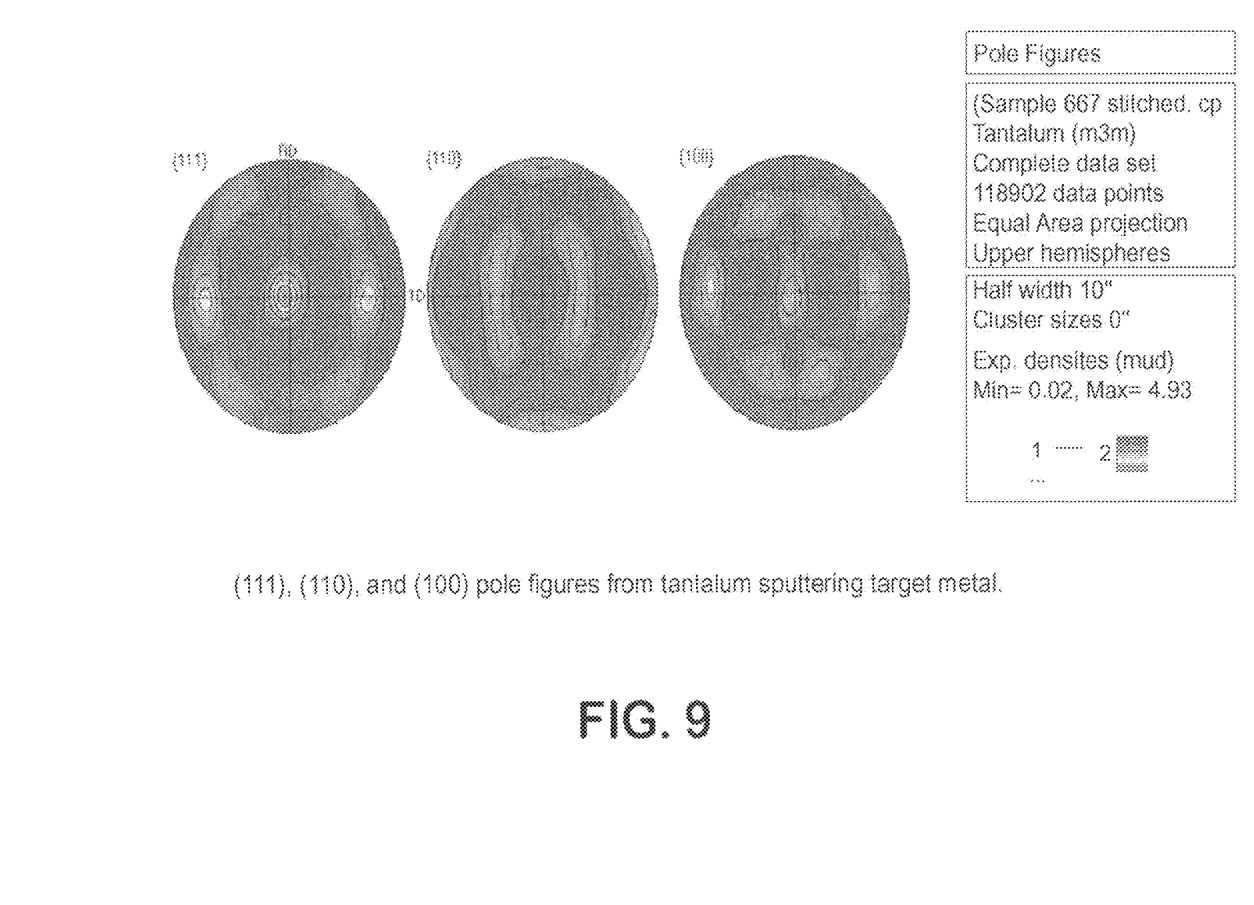
FIG. 9 provides (111), (110), and (100) pole figures for tantalum plate obtained by conventional orthogonal rolling.

In at least one embodiment of the present invention, the present invention obtains an axial texture for the metal articles such as metal plates or targets. Preferably, the axial texture is a symmetrical axial texture. For instance, the axial texture of the metal article can have, as a primary axis, <111> or can have, as a primary axis, <100>. Some skilled in the art will use the term "predominant" texture or "strong" texture to characterize crystallographic texture with the primary axis of <111> or with the primary of <100>. For instance, as shown in FIG. 3 of the present application, an example of an axial texture for tantalum plate, which happens to be a sputtering target, is shown. FIG. 3 shows strong axial primary crystallographic texture of <111>. U.S. Pat. No. 6,348,113 B1 provides a description of "texture" and related terms. The <110> and <100> poles are randomly distributed and/or have a symmetrical axial texture as a result of a rotation about the <111> axis as shown in FIG. 3. For purposes of the present invention, the present invention further relates to metal articles such as metal plates or sputter targets, such as BCC metal articles (e.g., BCC metal plates or BCC metal sputter targets, such as tantalum, niobium, or alloys thereof) that have an axial texture where, in the axial texture, the primary axis is <111> or <100>. As can be seen by comparing FIG. 3 with FIG. 9, wherein FIG. 9 represents a tantalum plate made by conventional thermomechanical orthogonal rolling, the <110> and <100> pole distributions are not random and/or are unsymmetrical and are more directional with respect to its orientation relative to the primary (111) crystallographic texture. This stronger orientation in certain directions leads to less uniform sputtering of the target. Accordingly, in one embodiment of the present invention, the present invention relates to a metal article that has the pole figures of FIG. 3 where it is understood that the primary axis can be <111> or <100>. While FIG. 3 shows a primary (111) crystallographic texture, is to be understood that a similar pole figure can be achieved where the axis is a primary (100) crystallographic texture. This axial texture is especially important with rolled plate such as BCC metal rolled plate or BCC metal sputter targets. In addition, the present invention permits one to obtain a very strong axial primary (111) crystallographic texture or a very strong axial primary (100) crystallographic texture wherein the non-primary crystallographic texture is very weak in the axis.

Preferably, the metal is at least partially recrystallized, and more preferably at least about 80% of the tantalum metal is recrystallized and even more preferably at least about 98% of the tantalum metal is recrystallized. Most preferably, the tantalum metal is fully recrystallized. For instance, the tantalum product preferably exhibits a uniform texture of mixed or primary (111) on the surface, throughout its thickness, or a combination thereof as measured by electron backscatter diffraction (EBSD), such as TSL's Orientation Imaging Microscopy (OIM) or other acceptable means. The resulting tantalum can include an excellent fine grain size and/or a uniform distribution. The tantalum preferably has an average recrystallized grain size of about 150 microns or less, more preferably about 100 microns or less, and even more preferably about 50 microns or less. Ranges of suitable average grain sizes include from about 5 to about 150 microns; from about 30 to about 125 microns, and from about 30 to about 100 microns.

Preferably, the sputtering targets made from the tantalum of the present invention have the following dimensions: a thickness of from about 0.080 to about 1.50", and a surface area from about 7.0 to about 1225 square inches. Other dimensions can be made.

The definition of true strain is e=Ln(ti/tf), where e is the true strain or true strain reduction, ti is the initial thickness of the plate, tf is the final thickness of the plate, and Ln is the natural log of the ratio.

The metal plate of the present invention can have a surface area that has less than 75%, such as less than 50% or less than 25%, of lusterous blotches after sputter or chemical erosion. Preferably, the surface area has less than 10% of lusterous blotches after sputter or chemical erosion. More preferably, the surface area has less than 5% of lusterous blotches, and most preferably, less than 1% of lusterous blotches after sputter or chemical reacting.

The various uses including formation of thin films, capacitor cans, capacitors, and the like as described in U.S. Pat. No. 6,348,113 can be achieved here and to avoid repeating, these uses and like are incorporated herein. Also, the uses, metal articles, shapes, target components, the grain sizes, texture, purity that are set forth in U.S. Pat. No. 6,348,113 can be used herein for the metals herein and are incorporated herein in their entirety.

The metal plate of the present invention can have an overall change in pole orientation ($\Omega$). The overall change in pole orientation can be measured through the thickness of the plate in accordance with U.S. Pat. No. 6,462,339. The method of measuring the overall change in pole orientation can be the same as a method for quantifying the texture homogeneity of a polycrystalline material. The method can include selecting a reference pole orientation, scanning in increments a cross-section of the material or portion thereof having a thickness with scanning orientation image microscopy to obtain actual pole orientations of a multiplicity of grains in increments throughout the thickness, determining orientation differences between the reference pole orientation and actual pole orientations of a multiplicity of grains in the material or portion thereof, assigning a value of misorientation from the references pole orientation at each grain measured throughout the thickness, and determining an average misorientation of each measured increment throughout the thickness; and obtaining texture banding by determining a second derivative of the average misorientation of each measured increment through the thickness. Using the method described above, the overall change in pole orientation of the metal plate of the present invention measured through the thickness of the plate can be less than about 50/mm. Preferably, the overall change in pole orientation measured through the thickness of the plate of the present invention, in accordance to U.S. Pat. No. 6,462,339 is less than about 25/mm, more preferably, less than about 10/mm, and, most preferably, less than about 5/mm.

The metal plate of the present invention, can have a scalar severity of texture inflection ($\Lambda$) measured through the thickness of the plate in accordance with U.S. Pat. No. 6,462,339. The method can include selecting a reference pole orientation, scanning in increments a cross-section of the material or portion thereof having a thickness with scanning orientation image microscopy to obtain actual pole orientations of a multiplicity of grains in increments throughout the thickness, determining orientation differences between the reference pole orientation and actual pole orientations of a multiplicity of grains in the material or portion thereof, assigning a value of misorientation from the references pole orientation at each grain measured throughout said thickness, and determining an average misorientation of each measured increment throughout the thickness; and determining texture banding by determining a second derivative of the average misorientation of each measured increment through the thickness. The scalar severity of texture inflection of the metal plate of the present invention measured through the thickness of the plate can be less than about 5/mm. Preferably, the scalar severity of texture inflection measured through the thickness of the plate in accordance with U.S. Pat. No. 6,462,339 is less than about 4/mm, more preferably, less than about 2/mm, and, most preferably, less than about 1/mm.

The tantalum metal or other metal of the present invention can be used in a number of areas. For instance, the metal can be made into a sputtering target or into chemical energy (CE) munition warhead liner which comprises the metal. The metal can also be used and formed into a capacitor anode or into a resistive film layer. The tantalum metal of the present invention can be used in any article or component which conventional tantalum or niobium or other bcc metal is used and the methods and means of making the various articles or components containing the conventional tantalum can be used equally here in incorporating the high purity tantalum metal into the various articles or components. For instance, the subsequent processing used in making sputtering targets, such as the backing plate, described in U.S. Pat. Nos. 5,753, 090, 5,687,600, and 5,522,535 can be used here and these patents are incorporated in their entirety by reference herein.

In the sputter application field, typically a sputtering target assembly has a sputtering target and a backing plate. For instance, a metal target or metal target blank (e.g., tantalum, titanium, aluminum, copper, cobalt, tungsten, etc.) is bonded onto a backing plate, such as a backing plate flange assembly such as copper, aluminum, or alloys thereof. To achieve good thermal and electrical contact between the target and the backing plate, these members are commonly attached to each other by means of explosion bonding, friction welding, friction brazing, soldering, brazing, diffusion bonding, clamping, and by epoxy cement and the like.

Examples of the backing plate include, but are not limited to, copper, or a copper alloy, tantalum, niobium, cobalt, titanium, aluminum, and alloys thereof, such as TaW, NbW, TaZr, NbZr, TaNb, NbTa, TaTi, NbTi, TaMo, NbMo, and the like. No limitation exists as to the type of materials used in the sputtering target and the backing plate. The thicknesses of the backing and the target material can be any suitable thickness used for forming sputtering targets. Alternatively, the backing plate and the target material or other metal plate to be bonded onto the backing plate can be any suitable thickness for the desired application. Examples of suitable thicknesses of the backing plate and of the target material include, but are not limited to, a backing plate with a thickness of from about 0.25 or less to about 2 inches or more in thickness and targets with a thickness ranging from about 0.060 inches to about 1 inch or greater. In the present invention, the target material to be bonded onto the backing plate can be conventional target grade material for instance as described in U.S. Pat. No. 6,348,113, incorporated in its entirety by reference herein. The sputtering target can also have an interlayer as is conventional in the industry. Furthermore, the sputtering target can be a hollow cathode magnetron sputtering target and can be other forms of sputtering targets such as planar magnetron assemblies incorporating stationary or rotating permanent or electromagnets. The purity, texture, and/or grain size and other parameters, including size and the like are not critical to the present invention. The present invention provides a method of making a sputtering target assembly with any type of sputtering target and backing plate.

In at least one embodiment, the target member used to practice the present invention includes two sides, a sputtering side and a bonding side which is opposed to the sputtering side. The backing member of the present invention includes two sides, a bonding side and a back side which is opposed to the bonding side. The sputtering target assembly of the present invention is formed or assembled by fixing the bonding side of the target member to the bonding side of the backing member. An interface is defined by an area between the bonding side of the target member and the bonding side of the backing member. The bonding sides can be fixed to each other such that a surface of the bonding side of the backing member and a surface of the bonding side of the target member are in substantial contact; the surfaces of the bonding sides are not in substantial contact; or, an interlayer can be interposed between a portion of the surfaces of the bonding sides. The interlayer can be a bonding media. The interlayer can also be in the form of a foil, plate, or block. Examples of interlayer materials can include, but are not limited to zirconium and the like and are conventional in the industry, titanium as found in U.S. Pat. No. 5,863,398 and U.S. Pat. No. 6,071,389; copper, aluminum, silver, nickel, and alloys thereof, as found in U.S. Pat. No. 5,693,203, and graphite as found in U.S. Pat. No. 6,183,613 B1, each of which is incorporated in its entirety by reference herein.

The present invention will be further clarified by the following examples, which are intended to be exemplary of the present invention.

EXAMPLES

Several different products have been produced using the process of the present invention. The following examples are provided to illustrate how the product is produced.

Product A was produced by first swaging an 11 inch diameter tantalum ingot to a 5 inch diameter and then annealing the swaged ingot at 1050° C. for 2 hours. The annealed swaged ingot was then cut into a billet (3.24 inches tall). This billet was forged to a height of 1.26 inches. The forged billet was clock rolled using 9 to 27 passes in order to obtain a finish thickness of 0.36 inches. The rolled plate was annealed at 1050 C for 2 hours. Target disks produced in this way have a true strain prior to the final anneal of approximately 2.19 and have an average grain size of 30 μm and approximately 77% of their (111) planes aligned parallel to the plate surface. Disks produced in this example have a diameter of 15 inches.

An alternative method for producing product A is to not anneal after the swaging operation. In this case, the total true strain in the part prior to the final anneal is 2.98 and the average grain size is 30 μm with 77% of their (111) planes aligned parallel to the plate surface.

In another example, Product B was produced by swaging an 11 inch diameter Ta ingot to 5 inches in diameter, cutting into billets (5.29 inches in length) and then annealing at 1050° C. for two hours. The annealed billets were forged to a height of 2 inches and clock rolled to obtain a finish thickness of 0.55 inches. After rolling, the disks were annealed at 1050° C. for two hours and then trimmed to produce a final diameter of 15.5 inches. In this case, the part had a true strain of 2.26 prior to the final anneal. After annealing, this part had an average grain size of 63 μm with 61% of its grains with their (111) planes aligned parallel to the plate surface.

In yet another example, Product C was produced by swaging an 8-inch diameter ingot to 5 inches in diameter, cutting into billets (5.76 inches in length) and then annealing at 1050° C. for two hours. The annealed billets were then forged to a height of 1.75 inches and clock rolled to obtain a finish thickness of 0.36 inches. After rolling, the disks were annealed at 1050° C. for two hours and then trimmed to produce a final diameter of 20 inches. In this case, the part had a true strain of 2.77 prior to the final anneal. After annealing, this part had an average grain size of 50 μm with 75% of its grains with their <111> direction aligned parallel (within 10 degrees) to the plate surface normal.

In another example, Product D was produced by swaging an 11-inch diameter ingot to 6 inches in diameter, cutting into billets 6.4 inches in length and then forging to a height of 1.94 inches. The forged billet was clock rolled to a final thickness of 0.4 inch in 9 to 27 passes rotated 120 degrees between each rolling pass. The clock rolled plate was vacuum annealed at 1050° C. for two hours and then a disk with a diameter of 24 inches was cut from the disk. In this case, the part had a true strain of 3.03 prior to the final anneal. After annealing, this part had an average grain size of 34 μm with 95% of its grains with their <111> direction aligned parallel to the plate surface normal.

This Product (D) may also be produced by swaging an 11-inch diameter ingot to 5 inches in diameter, cutting into billets 9.22 inches in length and then annealing at 1050° C. for two hours. The part is protected from air during annealing by using a vacuum or by coating the billet with a protective coating of glass or other oxidation resistant coating. After annealing, the billet is forged to a height of 2.39 inches, clock rolled to a finish thickness of 0.4 inches using 9 to 27 rolling passes. The clock rolled plate is annealed at 1050° C. for two hours. Prior to annealing, the part had a true strain of 2.42 and, after annealing, this part had an average grain size of 55 μm with 64% of its grains with their (111) planes oriented parallel (within 10 degrees) with the plate surface.

In another example, Product E was produced by swaging an 8-inch diameter ingot to 6 inches in diameter, annealing at 1050° C. for one to three hours and then cutting into billets of 10 inches in length. The billets were forged to a height of 2.51 inches and then clock rolled to a final thickness of 0.4 inches. The rolled disk was vacuum annealed at between 975 and 1125 C for one to three hours. The disks prior to the final anneal had an unannealed true strain of 3.22 and, after annealing, had an average grain size of 38 μm with 82% of its grains with their <111> direction aligned parallel to the plate surface normal. This disk can be also produced without annealing between the swaging step and the forging step.

Typically, when conventional tantalum plate is rolled, the tantalum metal grains rotate under the applied stress to produce characteristic crystallographic orientations in the rolling and transverse directions. Then, when the rolled plate is then formed into a cup or dome shape, the flow of the tantalum during the cup or dome shape formation will vary relative to the rolling direction of the plate. These variations in flow characteristic that arises from differences in the metal crystallographic orientation cause the cup or dome shaped object to ear, which is undesirable. Earing occurs whenever rolled plate that is not isotropic in the rolling plane is formed into cup shapes. Earing reduces the material efficiency of the process, since additional material must be added to the plate so that there is enough material after earring to produce the finished target. The present invention reduces or completely eliminates earing since the present invention provides a plate or target that deforms isotropically in any direction within the disk plate, thus avoiding or reducing the earing problem.

Figure 7:
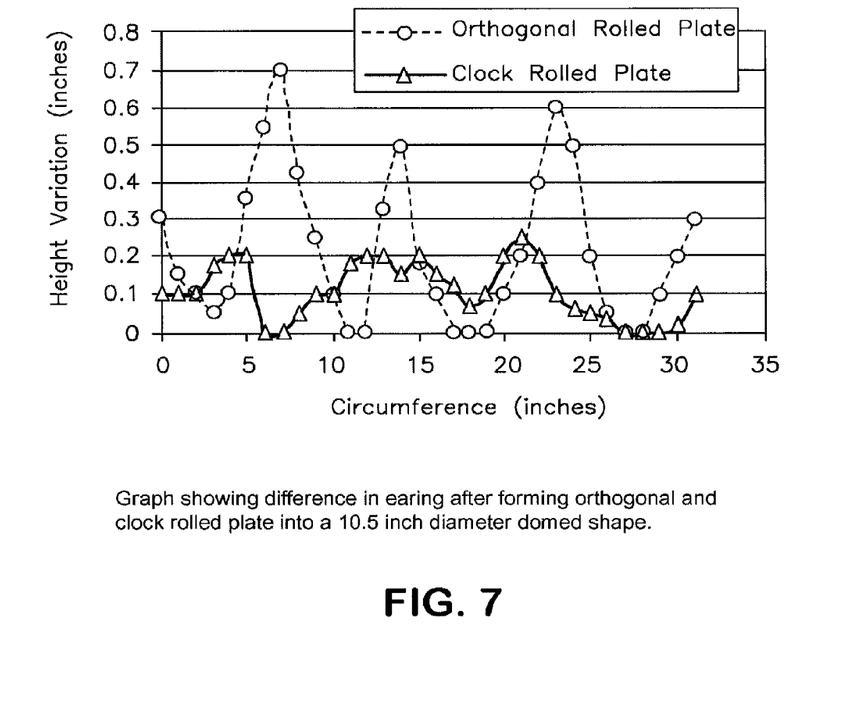
FIG. 7 is a graph showing the reduction in earing in tantalum plate formed into cup or dome shape for use in manufacturing hollow-cathode sputtering targets when isotropic tantalum plate is produced using circular processing.

In some sputtering target designs, the metal plate is further shaped into a more complex shape. Examples of these types of sputtering targets include the designs using a hollow-cathode structure. In this case, spin forming, forging, hydropressing, drawing or other methods of forming metal plate are used to produce a domed or cupped shape with the sputtering plasma contained within the more complex shape. When these more complex shapes are required, the metal plate should deform isotropically in any direction within the disk plane. FIG. 7 shows the difference in earing between tantalum plate using orthogonal rolling processes and tantalum plate using the clock rolling process, such as a 120-degree clock rolling process. The data in FIG. 7 demonstrates that the clock rolling reduces earing by from 0.7 inch to 0.25 inch.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A niobium metal plate that is circular in shape and having a rolling plane and a thickness of 0.080 to 1.5 inch, wherein said niobium metal plate is isotropic in said rolling plane and deforms isotropically in any direction within said rolling plane and said niobium metal plate has a crystallographic texture throughout said thickness wherein said crystallographic texture has a pole figure with an axial symmetrical texture with an axis normal to said rolling plane, wherein said axis has a primary axial <111> crystallographic texture, with <110> texture and <100> texture poles that are randomly distributed or have a symmetrical texture around said axis, or said axis has a primary axial <100> crystallographic texture, with <110> texture and <111> texture poles that are randomly distributed or have a symmetrical texture around said axis, and said niobium metal plate has a percent texture banding area of less than 0.5% with respect to overall area and volume of said niobium metal plate that is inconsistent or non-uniform with respect to the primary texture present in said niobium metal plate, and said niobium metal plate has a purity of at least 99.95% Nb and an average grain size of 150 microns or less.

2. The niobium plate of claim 1, wherein said niobium metal plate is a sputter target disk.

3. The niobium metal plate of claim 1, wherein said percent banding area is from 0.1 to 0.25%.

4. The niobium metal plate of claim 1, wherein said axis is a primary axial <111> crystallographic texture, with <110> texture and <100> texture poles that are randomly distributed or have a symmetrical texture around said axis.

5. The niobium metal plate of claim 1, wherein said axis is a primary axial <100> crystallographic texture, with <110> texture and <111> texture poles that are randomly distributed or have a symmetrical texture around said axis.

6. The niobium metal plate of claim 2, further comprising a backing plate attached to said sputter target disk.

7. The niobium metal plate of claim 1, wherein said primary texture is a primary (111) texture.

8. The niobium metal plate of claim 1, wherein said percent texture banding area is with respect to (100) texture banding.

9. The niobium metal plate of claim 1, wherein said metal article has a uniform mixed (111):(100) texture.

10. The niobium metal plate of claim 7, wherein said niobium metal plate is a sputter target blank.

11. The niobium metal plate of claim 1, wherein said niobium metal plate is a sputter target that is bonded to a backing plate.

12. The niobium metal plate of claim 1, wherein percent banding area is from 0.1 to less than 0.5%.

13. The niobium metal plate of claim 1, wherein percent banding area is from 0.1 to 0.4%.

* * * * *